United States Patent [19]
Iriki et al.

[11] Patent Number: 5,497,331
[45] Date of Patent: Mar. 5, 1996

[54] SEMICONDUCTOR INTEGRATED CIRCUIT DEVICE FABRICATION METHOD AND ITS FABRICATION APPARATUS

[75] Inventors: Nobuyuki Iriki; Tsutomu Okabe, both of Kodaira; Kenji Watanabe, Ohme; Hisashi Maejima, Higashiyamato; Shinji Kuniyoshi, Tokyo, of, Japan

[73] Assignee: Hitachi, Ltd., Tokyo, Japan

[21] Appl. No.: 257,262

[22] Filed: Jun. 8, 1994

[30] Foreign Application Priority Data

Jun. 21, 1993 [JP] Japan ................................. 5-148892

[51] Int. Cl.⁶ ............................. G06F 19/00; G06F 17/60
[52] U.S. Cl. ........................ 364/468; 395/900; 395/904; 364/552
[58] Field of Search ................................. 395/900, 903, 395/904, 906, 61, 912, 914; 364/468, 480, 488–490, 551.01, 552; 430/311–313; 355/53, 55, 77; 437/7, 8, 924, 928, 225, 229

[56] References Cited

U.S. PATENT DOCUMENTS

| | | | |
|---|---|---|---|
| 5,388,186 | 2/1995 | Bose | 395/903 |
| 5,392,361 | 2/1995 | Imaizumi et al. | 395/900 |
| 5,410,495 | 4/1995 | Ramamurthi | 395/900 |

FOREIGN PATENT DOCUMENTS

| | | |
|---|---|---|
| 63-122913 | 5/1988 | Japan. |
| 2-224319 | 9/1990 | Japan. |
| 4-277802 | 10/1992 | Japan. |

OTHER PUBLICATIONS

Shoichiro Kinoshita, et al., "Achieving an Automated 8–inch Line for 4–Mbit Memory at Yasu Works of IBM Japan Ltd.—Using Feedback Control in the Exposure Process and Failure Analysis Software", *Nikkei Microdevices*, Jun., 1991, pp. 87–95 (full translation).

*Primary Examiner*—Roy Envall
*Assistant Examiner*—Steven R. Garland
*Attorney, Agent, or Firm*—Pennie & Edmonds

[57] ABSTRACT

A semiconductor integrated circuit device fabrication technique improves the accuracy of element qualities by considering the influence of interaction of element quality parameters in the quality control of semiconductor fabrication processes and also by improving the product yield estimation accuracy so that the production efficiency can be improved. An initial value of a membership function is first set and then a plurality of element quality parameters and a combined quality parameter are expressed by membership functions in fuzzy control in a semiconductor fabrication apparatus for automating a fabrication method by connecting a computer with various measuring instruments and various processors by communication devices. Moreover, the combined quality parameters are fuzzy-inferred from the element quality parameters using these membership functions, inference rules are adjusted by data of the actual processes, the membership functions of the obtained element quality parameters are converted into an element quality control standard, and the semiconductor integrated circuit device fabrication processes are controlled in accordance with the standard.

8 Claims, 9 Drawing Sheets

FIG. 3
FIG. 6
RULE 1: X₂ IS SMALL,
THEN Y IS LARGE
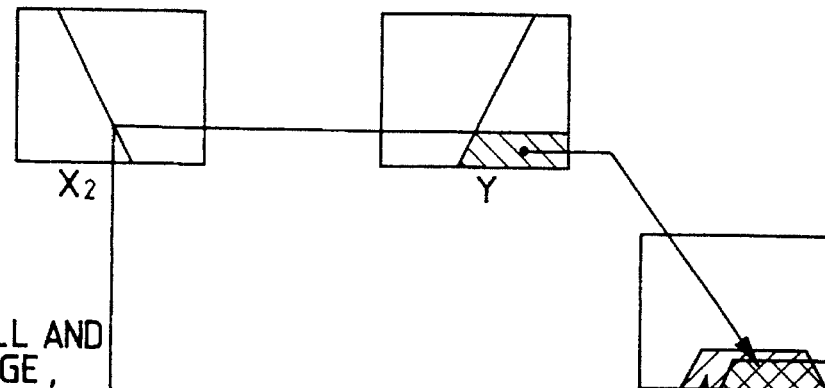
RULE 2: X₁ IS SMALL AND
X₂ IS LARGE,
THEN Y IS A
LITTLE LARGE
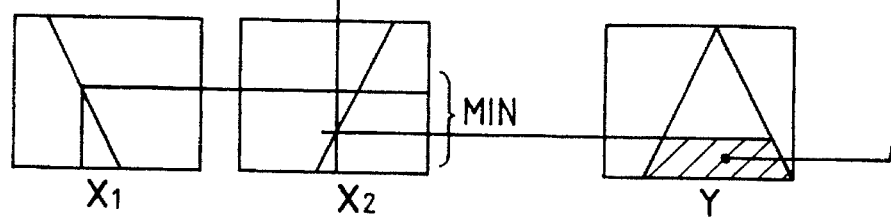

◎ : MEMBERSHIP FUNCTION
$X_1, X_2, X_3$ : ELEMENT QUALITY PARAMETER
$Y_1, Y_2$ : COMBINED QUALITY PARAMETER

SEMICONDUCTOR INTEGRATED CIRCUIT DEVICE FABRICATION METHOD AND ITS FABRICATION APPARATUS

BACKGROUND OF THE INVENTION

The present invention relates to a technique for fabricating a semiconductor integrated circuit device, particularly to a technique that can be effectively applied to a semiconductor integrated circuit device fabrication method and its fabrication apparatus, which can be applied to registration of circuit patterns and control of exposure, for example, in an exposure process, in the quality control of fabrication processes and the control technique of apparatus accuracy.

For example, to fabricate a semiconductor integrated circuit device by using a technique for fabricating a semiconductor integrated circuit device, it is necessary to accurately control the shapes and thicknesses of more than ten circuit pattern layers and superimpose the pattern layers by accurately adjusting the positions of the pattern layers. This is because a change of the shape and thickness of each pattern layer and misregistration of the pattern layers degrades the characteristics, reliability, and yield of a semiconductor integrated circuit device.

Therefore, when a fine circuit pattern is formed on a semiconductor wafer by an aligner in the semiconductor integrated circuit device fabrication process, the precision of the pattern shape and the relative positional accuracy with a circuit pattern already formed on the wafer are measured to ensure the accuracies before starting the exposure.

The pattern shape accuracy control is not necessarily only for an aligner for transferring a circuit pattern onto a wafer. Also in the case of an etching system for etching a base thin film using a photoresist on which a pattern is formed as a mask, it is necessary to ensure the accuracy before starting the process.

Also in the case of the process of forming a thin film on a wafer in a semiconductor fabrication process, it is necessary to ensure the accuracy by measuring the thickness and electric characteristics of the formed thin film before starting process.

In the case of the prior art for improving the yield, characteristics, and reliability of a semiconductor integrated circuit device by ensuring each element quality of the semiconductor fabrication process and then controlling the processor, measurement is performed for each element quality by using measuring instruments, variation of element qualities is controlled by setting target values and control limits, and correction for making each element quality approach the target value is carried out by adjusting the processor when variations from the target values occur.

For the element quality control in the semiconductor integrated circuit device fabrication process, data is collected by data communication from the measuring instruments to an external computer in accordance with the necessity of automation. This is prescribed by the SEMI standard and spread.

For example, a system for collecting data for small dimensions measured by dimension measuring instruments and storing them in a host computer is disclosed in Japanese Patent Laid-Open No. 122913/1988. In this case, the collected dimension data is used for precise control of pattern dimensions by a statistical control method using the host computer.

It is necessary to sort the above dimension data according to measured objects and then subjecting them to time-series analysis and statistical control. The prior art of the time-series analysis and statistical control is disclosed in Japanese Patent Laid-Open No. 123051/1991. In the case of the prior art, the dimensions data is classified according to the type of products using a host computer through the communication means to control the differences between target values and measured values which will be described later. In this case, the dimension value which is a single element quality is controlled for each measured object.

The prior art of the automatic collection of element quality data and feedback of the data to a processor and the application of the data to analysis of the characteristics and failures of semiconductor integrated circuit devices is described in, for example, NIKKEI Microdevice, pp. 87–95, June, 1991. In this prior art corrected amounts computed from deviations from target values are given to measured dimensions and alignment deviations respectively and the correlation between various element quality data values and electric characteristics of a semiconductor integrated circuit device through a regression analysis for the failure analysis.

Moreover, another prior art of a method for correcting a processing parameters of a processor for a target value of individual element quality parameter is disclosed in Japanese Patent Laid-Open No. 224319/1990, in which the correlation between the element quality parameter and the processing parameter of a processor is determined to compute a corrected value of the processing parameter.

A prior art using fuzzy inference to compute a corrected value is disclosed in Japanese Patent Laid-Open No. 277802/1992. In this prior art a new corrected value of a processor is found by the equation $Pi'=Pi+Ci$ where the corrected value of the processor is $Pi$, and the corrected value determined from the deviation of the element quality parameter from the target value through fuzzy inference is $Ci$. In this case, it is estimated that a membership function used for fuzzy inference is determined in accordance with the controllability of the corrected value $Pi$ for the element quality parameter.

Still another prior art for regression-analyzing the correlation between the element quality data and electrical characteristics of a semiconductor integrated circuit device is disclosed in Japanese Patent Laid-Open No. 277802/1992. In this prior art, the accuracy of coordinating data when performing correlation analysis by considering the distribution in a wafer based on not only the statistical data of each wafer and each lot but information about mapping.

In this prior art, the data is are automatically retrieved from the storage media or through communication means by the host computer, which have been manually inputted conventionally. In this case, the collected data is used to support the analysis by an engineer through contour lines or a scatter diagram.

SUMMARY OF THE INVENTION

In the semiconductor integrated circuit device fabrication processes, more accurate pattern shape and alignment have been required in recent years because devices and wirings have further been made smaller and the number of wiring layers has been increased.

In this case, as described in the prior arts, it is important not only to adjust each element quality parameter to a target value at a high producibility but to improve the accuracy of setting the target value so that the performance, reliability, and yield of a semiconductor integrated circuit device are improved.

Moreover, to set the target values and parameters for controlling element qualities including control limits, it is further necessary to consider the interaction of element quality parameters between a plurality of layers with the increase in the number of wiring layers.

However, the improvement of the accuracy of element quality parameters including the setting of the target values and control limits relates to the interaction of circuit and process designs and actual process variations, and it has not been considered in the above prior arts, bringing up a problem.

In the case of this problem, each factor is hitherto analyzed by regression analysis means or the like by a trial and error basis. However, because interactive problems are solved by the intuition of the engineers as described in the above documents, it is difficult to overcome the trend that the influence of interaction of element qualities between a plurality of layers strengthens with the increase in the number of wiring layers.

Moreover, because the conventional analyses using regression analysis means or the like are done off-line, measurement taking is delayed, which causes the yield to decrease for a long time.

Therefore, the present invention was made to solve the above problems and its object is to provide a semiconductor integrated circuit arrangement fabrication method and its fabrication device, by which, in the semiconductor integrated circuit device fabrication process, the productivity is improved by considering the influence of element quality parameters on the characteristics, reliability, and yield of products due to the interaction of the parameters, automatically determining the target values of element quality parameters and the parameters related to the control standard, and thereby improving the accuracy of element qualities and also improving the accuracy of estimating the yield of products based on the measured element qualities.

Moreover, it is an object of the present invention to provide a technique suitable for alignment or dimension control in a lithography process such as the reduction exposure for forming a reduced pattern of the original pattern of a mask onto a resist film on a semiconductor wafer by using ultraviolet rays or far-ultraviolet rays as exposure light in a submicron-pattern dimensional region close to the limit of the exposure light and using a lens reduction aligner.

It is another object of the present invention to provide a technique suitable for alignment or dimension control in a lithography process such as a reduction exposure using a phase shift mask for forming a reduced pattern of the original pattern of a mask onto a resist film on a semiconductor wafer by using ultraviolet rays or far-ultraviolet rays as exposure light in a submicron-pattern dimensional region close to the limit of the exposure light and using a lens reduction aligner.

It is still another object of the present invention to provide a technique using fuzzy inference and suitable for alignment or dimension control in a lithography process such as a reduction exposure for forming a reduced pattern of the original pattern of a mask onto a resist film on a semiconductor wafer by using ultraviolet rays or far-ultraviolet rays as exposure light in a submicron-pattern dimensional region close to the limit of the exposure light and using a lens reduction aligner.

The above and other objects and novel features of the present invention will become more apparent from the description of this specification and the accompanying drawings.

The following is the brief description of the outline of typical inventions among those disclosed in this application.

That is, a semiconductor integrated circuit device fabrication method of the present invention is such that, in the semiconductor integrated circuit device fabrication processes a membership function in fuzzy inference is so adjusted as to improve the accuracy of inferring the yield of the semiconductor integrated circuit device by using fuzzy inference for the quality control, and the process is controlled under a desirable element quality parameter state obtained from the adjusted membership functions.

Moreover, a semiconductor integrated circuit device fabrication method of the present invention is such that, in semiconductor integrated circuit device fabrication process, fuzzy-inference is used for quality control, parameters of a membership function of an element quality in the fuzzy inference are adjusted to minimize the inference errors, and the semiconductor integrated circuit device fabrication process is controlled by using the adjusted membership functions as the control standard of the element quality parameters.

Furthermore, the semiconductor integrated circuit device fabrication method of the present invention is such that, the method comprises a first step of expressing the standard of the element quality parameter by a membership function in fuzzy control, a second step of fuzzy-inferring combined quality parameters by using a plurality of element quality membership functions, and a third step of minimizing the sum of the squares of the errors of a plurality of combined quality parameters fuzzy-inferred by a plurality of combinations of measured element quality parameters and the errors of the corresponding measured combined quality parameters by adjusting the parameters of the membership functions showing the standard of the element quality parameters; wherein the membership functions obtained through the adjustment in the third step are used as the control standard of the element quality parameters.

Furthermore, the semiconductor integrated circuit device fabrication method of the present invention is such that the method is used for the quality control of a fine pattern forming step, the element quality parameters are used as the registration accuracy and the dimension accuracy of a plurality of layers, the standard of the registration accuracy and the dimension accuracy of these layers is expressed by the membership functions in the first step, the decrease of the registration allowance due to combination of the registration accuracy and the dimension accuracy of these layers is fuzzy-inferred as the combined quality parameters in the second step, the membership functions are adjusted by using the registration allowance fuzzy-inferred by the measured registration accuracy and dimension accuracy of these layers and the teacher data of measured registration allowance in the third step, and the membership functions determined through the above adjustment are used as the control standard of the registration accuracy and the dimension accuracy of a plurality of layers.

Furthermore, the semiconductor integrated circuit device fabrication method of the present invention is such that the combined quality parameters are used as data of fraction defective of semiconductor integrated circuit devices due to decrease of registration allowance, the data of the fraction defective of semiconductor integrated circuit devices due to decrease of registration allowance are fuzzy-inferred in the second step, a membership functions are adjusted by using the registration allowance fuzzy-inferred by the measured registration accuracy and dimension accuracy of a plurality of layers and the teacher data of the measured fraction-defective data in the third step, and the membership functions determined through the above adjustment are used as the control standard of the registration accuracy and dimension accuracy of a plurality of layers.

Furthermore, the semiconductor integrated circuit device fabrication method of the present invention is such that, the combined quality parameters are used as data of fraction defective of semiconductor integrated circuit devices due to a plurality of failure modes, the data of the fraction defective of semiconductor integrated circuit devices due to the plurality of defective modes are fuzzy-inferred in the second step, membership functions are adjusted by using the fraction defective data of these failure modes fuzzy-inferred by a plurality of measured element quality parameters and the teacher data of the measured fraction defective data in the third step, and the membership functions determined through the above adjustment are used as the control standard of a plurality of element quality parameters.

Furthermore, the semiconductor integrated circuit device fabrication method of the present invention is such that, the method comprises a fourth step of fuzzy-inferring the fraction defective of semiconductor integrated circuit devices due to the failure modes based on the results of measurement of a plurality of element quality parameters by using the membership functions determined by the adjustment in the third step, and a fifth step of estimating the yield of the semiconductor integrated circuit devices in accordance with the fraction defective inferred in the fourth step, and production is controlled according to the estimated value obtained in the fifth step.

Furthermore, the semiconductor integrated circuit device fabrication method stated in claim 8 of the present invention is such that, in the semiconductor integrated circuit arrangement fabrication method according to claim 3, the membership functions of the element quality parameters determined through the adjustment in the third step are used, the satisfaction degree A of the membership functions relating to the variation from the target values of the measured element quality parameter is determined with respect to the difference e of measured element quality parameters of the previously processed lot from the target values, and a processor is corrected by assuming the relation between predetermined values of correction of the processor and the differences as $\Delta x = F(e)$ and using the expression $\Delta x = A \times F(e)$ in which the satisfaction degree A is used as an acceleration factor.

Furthermore, the semiconductor integrated circuit device fabrication apparatus according to the apparatus comprises measuring instruments for measuring the above element quality parameters, an inspecting device for measuring the above combined quality parameters, data transfer means for connecting the measuring instruments and the inspecting devices, and a data processor for coordinating the processings in the first to third steps and the qualities, measuring points, and sample number of the semiconductor integrated circuit devices, collection of data from the measuring instrument and the inspecting device, the adjustment of the membership function, and inference of the combined quality parameters, are automatically performed, and the qualities in the semiconductor integrated circuit device fabrication process are controlled.

The semiconductor integrated circuit device fabrication method makes it possible to accurately control the semiconductor integrated circuit device fabrication process by using fuzzy inference for the quality control in the semiconductor integrated circuit device fabrication processes, adjusting a membership function in the fuzzy inference, and using desirable element quality parameters determined from the adjusted membership function. Therefore, it is possible to improve the semiconductor integrated circuit device fabrication yield by considering interactive influences between element quality parameters.

Moreover, the semiconductor integrated circuit device fabrication method makes it possible to accurately control the semiconductor integrated circuit device fabrication process by controlling element quality parameters for the quality control in the semiconductor integrated circuit device fabrication process by fuzzy inference, adjusting the parameters of a membership function in the fuzzy inference to minimize the inference errors, and using the adjusted membership function as the element quality parameter control standard. Therefore, it is possible to improve the fabrication yield by considering interactive influences on the characteristics, reliability, and yield of semiconductor integrated circuit devices.

Furthermore, the semiconductor integrated circuit device fabrication method makes it possible to accurately estimate the influence of interaction of element quality parameters on the variation of the combined quality parameter by a membership function in fuzzy inference adjusted by measured teacher data. Thus, the membership function obtained by the above adjustment shows the degree of the influence of each element quality parameter on the combined quality parameter in the process of the fuzzy inference and it can be converted into the element quality control standard necessary to obtain a desirable combined quality parameter. Therefore, it is possible to improve the accuracy of the combined quality parameters by controlling a processor in accordance with the control standard of the element quality parameter.

Furthermore, the semiconductor integrated circuit device fabrication method makes it possible to obtain the relation of decrease of the alignment allowances due to the combined action of the registration accuracy and dimension accuracy of the layers by membership functions optimized through the learning of teacher data in an actual process by the same means as the above by using a plurality of dimensional data values relating to pattern shapes of a plurality of layers and the registration accuracy of a plurality of layers as element quality parameters, and by using the decrease of the registration allowances of the layers as quality parameters. The decrease of combined registration allowance by converting the membership function into the control standard of each accuracy and using the standard for the control of an aligner. Thus, it is possible to prevent defectives due to registration allowances from occurring and the reliability and characteristics from degrading, and thus the yield can be improved.

Furthermore, the semiconductor integrated circuit device fabrication method makes it possible to obtain the relation between fraction defective and degradation of characteristics due to the combined action of the registration accuracy and dimension accuracy of a plurality of layers by a membership function optimized through the learning of the teacher data in an actual process in the same means as the above by using a plurality of dimensional data values relating to the pattern shapes of a plurality of layers and the registration accuracy of the layers as element quality parameters and also by using the fraction defective and the degradation of characteristics due to the decrease of registration allowances of the layers as combined quality parameters. Defectives due to registration allowances and degradation of the reliability and characteristics can be well controlled by converting the membership function into the control standard of each accuracy and by using the standard for the control of an aligner. Therefore, it is possible to improve the yield.

Furthermore, the semiconductor integrated circuit device fabrication method makes it possible to accurately estimate the influence of interaction of element quality parameters on the variation of a plurality of fraction defective data and its relation by using a plurality of fraction defective data due to a plurality of failure modes as a plurality of combined quality parameters and by obtaining a membership function in fuzzy inference adjusted by actually measured teacher data. Thus, the membership function obtained through the adjustment shows the degree of the influence of each element quality parameter on the above failure modes in the process of the fuzzy inference, and it can be converted into the element quality control standard necessary to prevent the failure modes. Therefore, it is possible to prevent a plurality of failure modes and improve the yield by controlling the processor in accordance with the element quality parameter control standard.

Furthermore, the semiconductor integrated circuit device fabrication method makes it possible to accurately estimate the influence of interaction of element quality parameters on the variation of a plurality of fraction defective data and its relation by using a plurality of fraction defective data due to a plurality of failure modes as a plurality of combined quality parameters and by obtaining a membership function in fuzzy inference adjusted by actually measured teacher data. Thus, because the membership function obtained through the adjustment shows the degree of the influence of each element quality parameters on the above failure modes in the process of the fuzzy inference, it is possible to estimate the total yield due to the failure modes and accurately estimate the final production. Therefore, by controlling the production in accordance with the estimation, it is possible to improve the production efficiency because appropriate production, not excessive nor insufficient one, is realized.

Furthermore, the semiconductor integrated circuit device fabrication method makes it possible to automatically set a dead zone and an acceleration factor in the setting of a quality correction value which is empirically performed by a method where the influence on the final quality is considered, in a fabrication line in which the quality is comparatively stabilized and accurately control the line quality accuracy without making it unstable.

Furthermore, the semiconductor integrated circuit device fabrication apparatus makes it possible to smoothly start the process for each type of product and decrease the number of engineers required for trial manufacture because the control standards can be adjusted appropriately using the standards of designing as initial values by inputting a prototype into a fabrication line and using data collected in the process of production.

Furthermore, the outline of one of the inventions disclosed in this application is a semiconductor integrated circuit device fabrication method comprising the steps of:

(a) forming photosensitive resist films on a plurality of semiconductor wafers successively;

(b) mounting the semiconductor wafers on the susceptor of a lens reduction projection aligner successively, and transferring a semiconductor circuit pattern on a mask substrate mounted on a mask mounting table of the aligner onto the resist films on the semiconductor wafers.

(c) patterning predetermined thin films on the wafers in accordance with the exposed resist films; and (d) controlling non-digital parameters for controlling predetermined process parameters by using at least one of the fuzzy logic, non-binary logic, and neuro-computing in the above steps (a) to (c). This makes it possible to accurately control device parameters for a semiconductor massproduction process in a submicron region.

BRIEF DESCRIPTION OF THE DRAWINGS

FIG. 3 is a scatter diagram used for a statistical technique in this embodiment;

FIG. 6 is an illustration showing fuzzy inference using a membership function in this embodiment;

DETAILED DESCRIPTION OF THE INVENTION

Embodiments of the present invention will be described below in detail.

Figure 1:
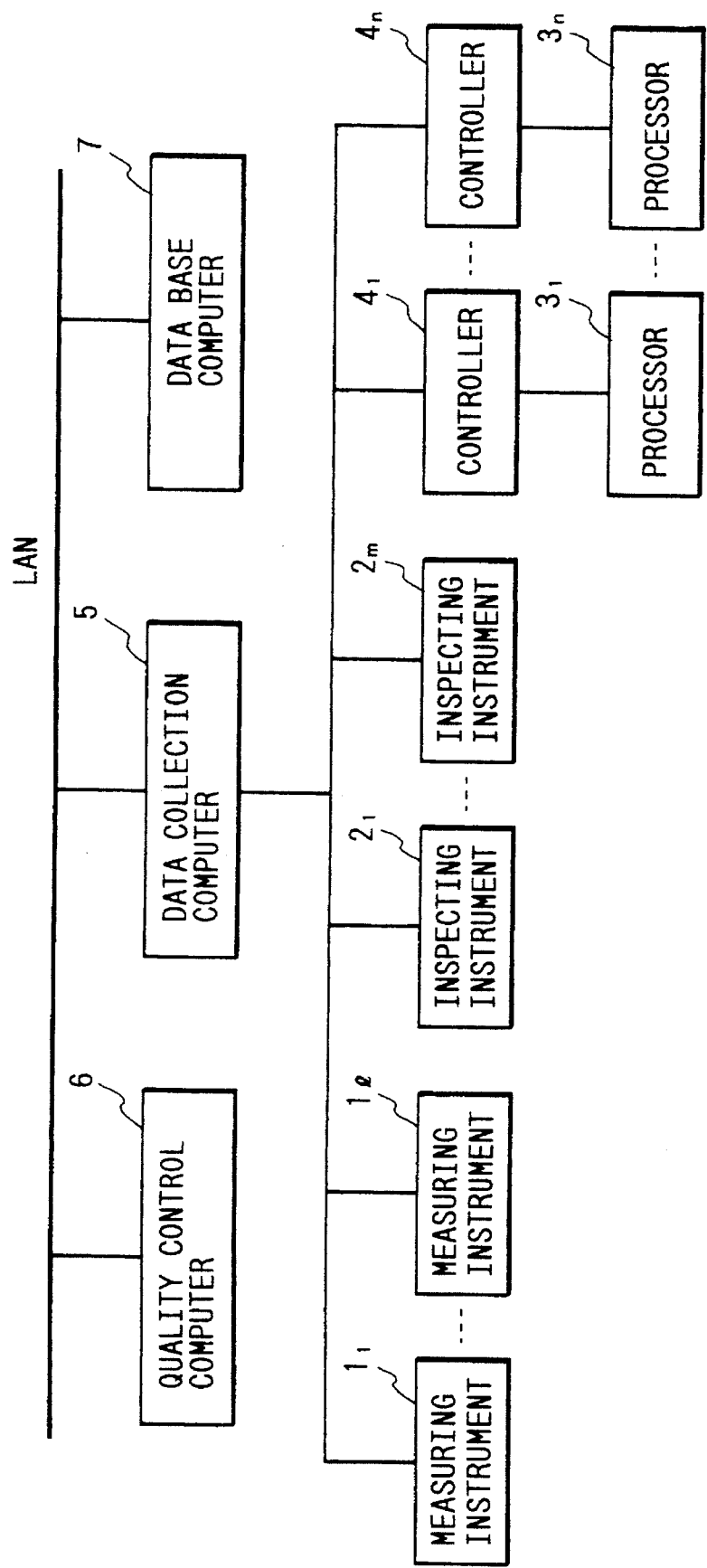
FIG. 1 is a block diagram of a semiconductor integrated circuit device fabrication apparatus which is an embodiment of the present invention.
Figure 2:
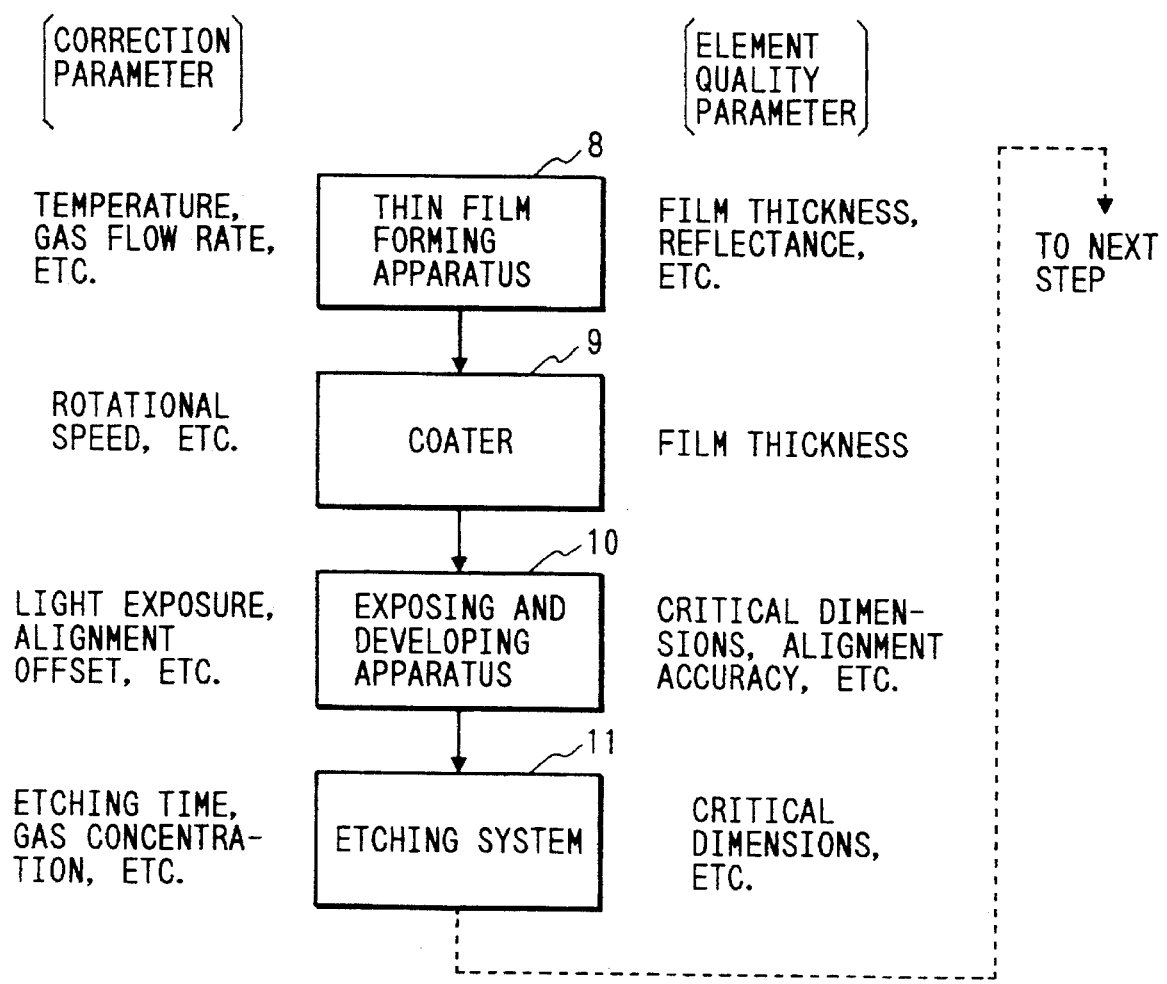
FIG. 2 is an illustration showing the semiconductor integrated circuit device fabrication processes in this embodiment.
Figure 4:
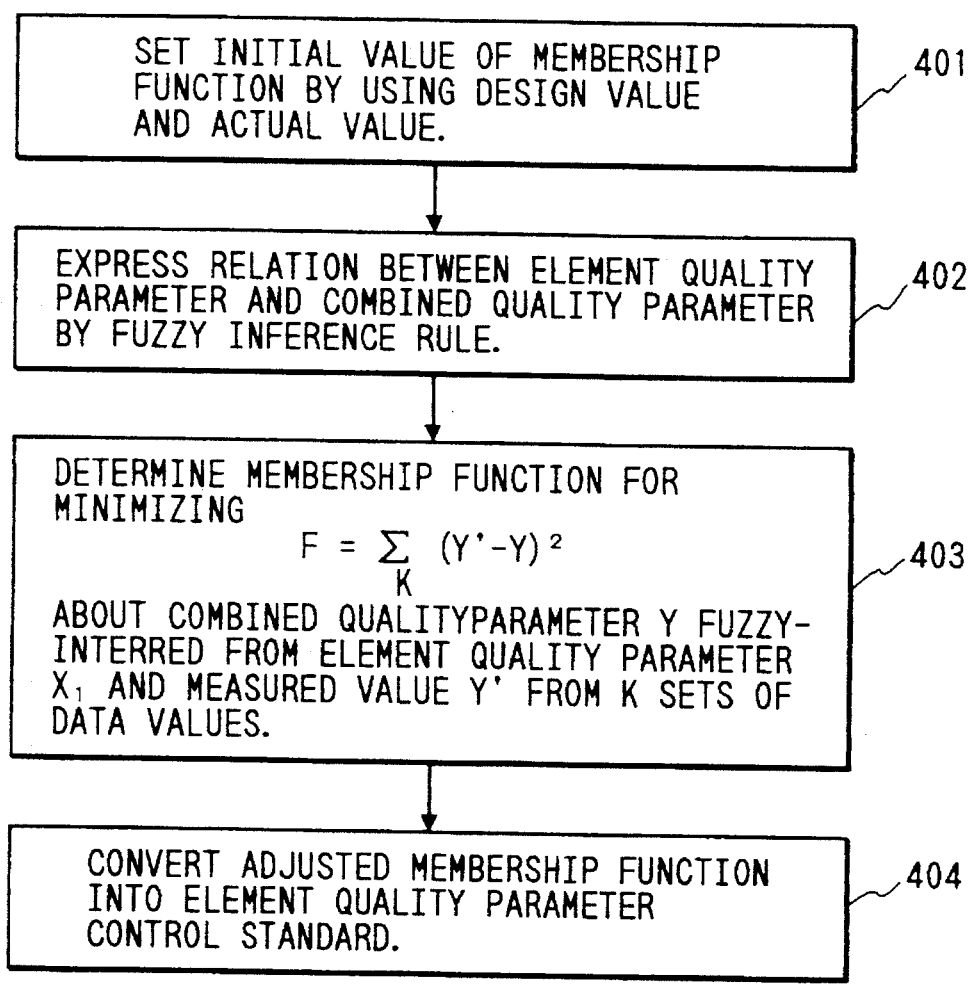
FIG. 4 is a flowchart showing a fabrication-process quality control method in this embodiment.
Figure 5A:
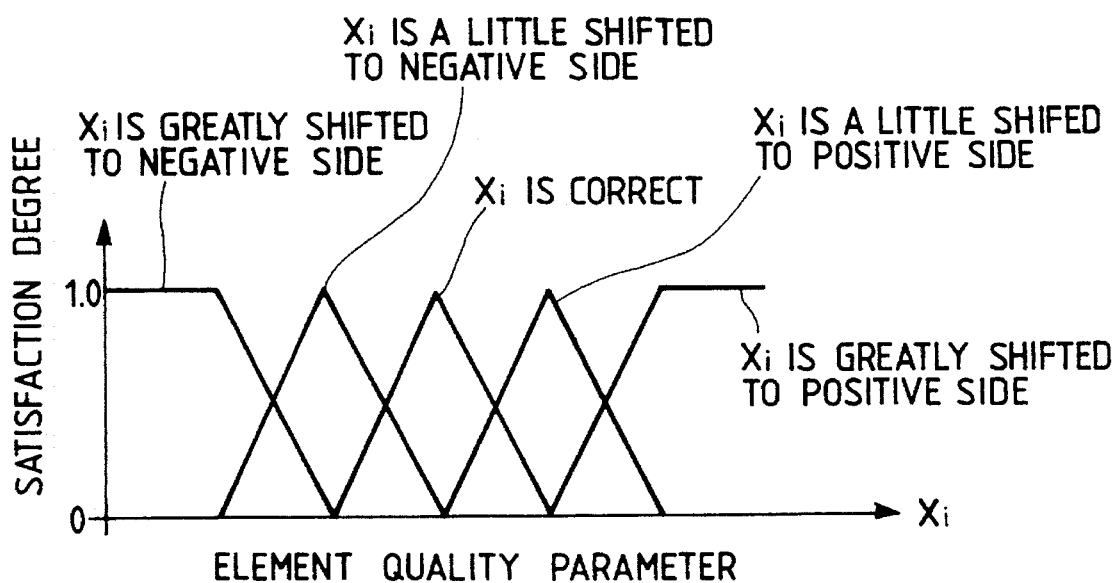
FIGS. 5(a) and 5(b) are illustrations showing an element quality parameter and combined quality parameter by a membership function in this embodiment.
Figure 5B:
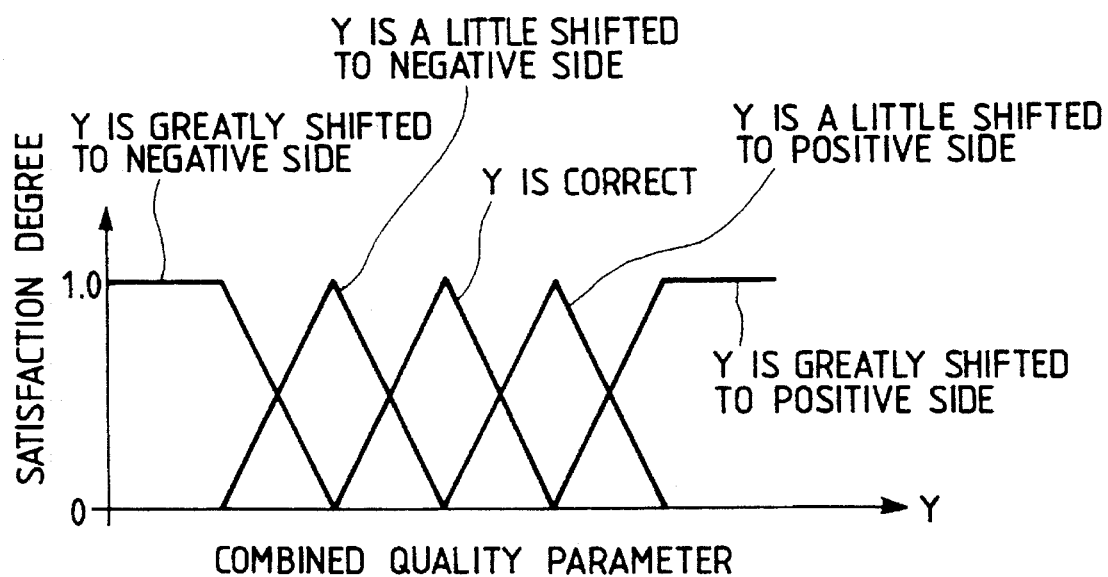
Figure 7:
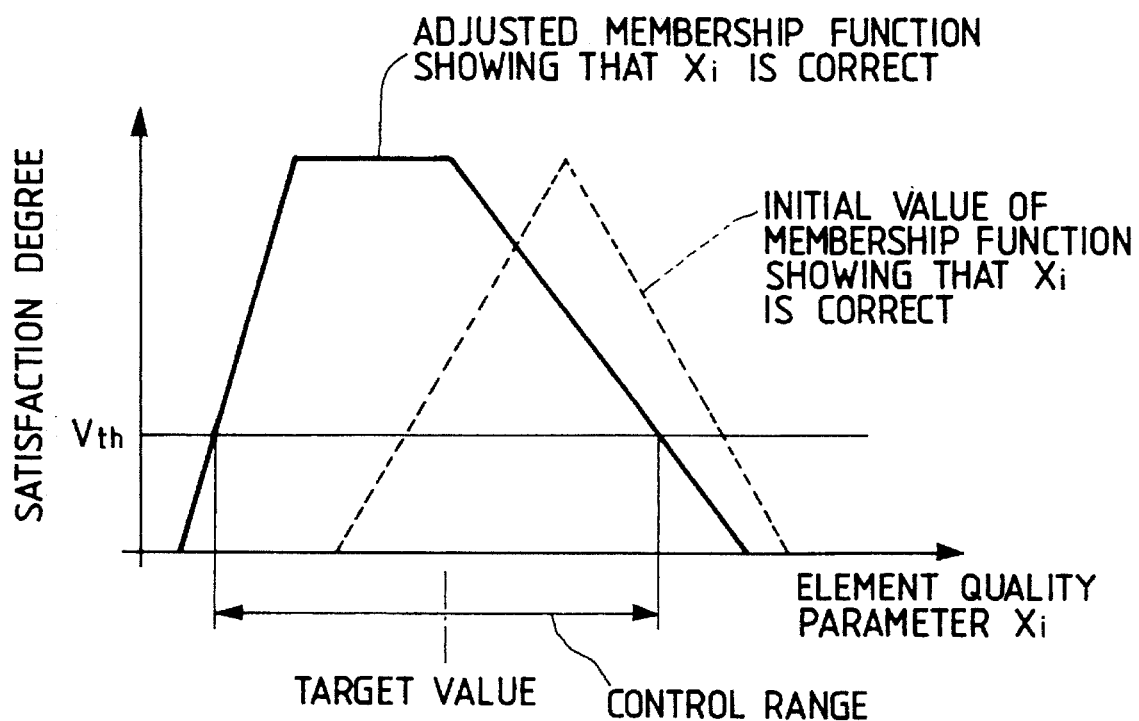
FIG. 7 is an illustration showing a processing in which a membership function is converted into an element quality parameter control standard in this embodiment.
Figure 8:
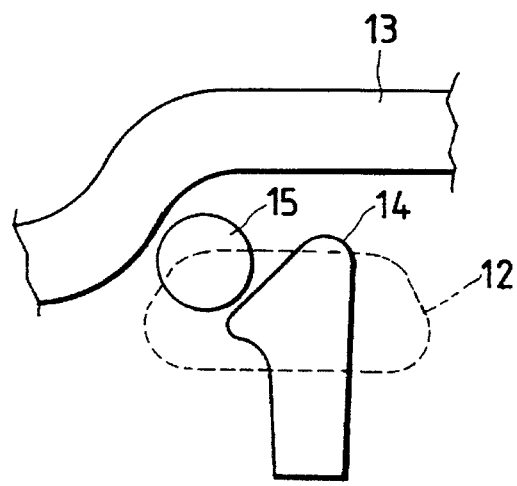
FIG. 8 is an illustration showing a case applied to the control of the dimension accuracy and registration accuracy of a fine pattern of a semiconductor integrated circuit device in this embodiment.
Figure 9:
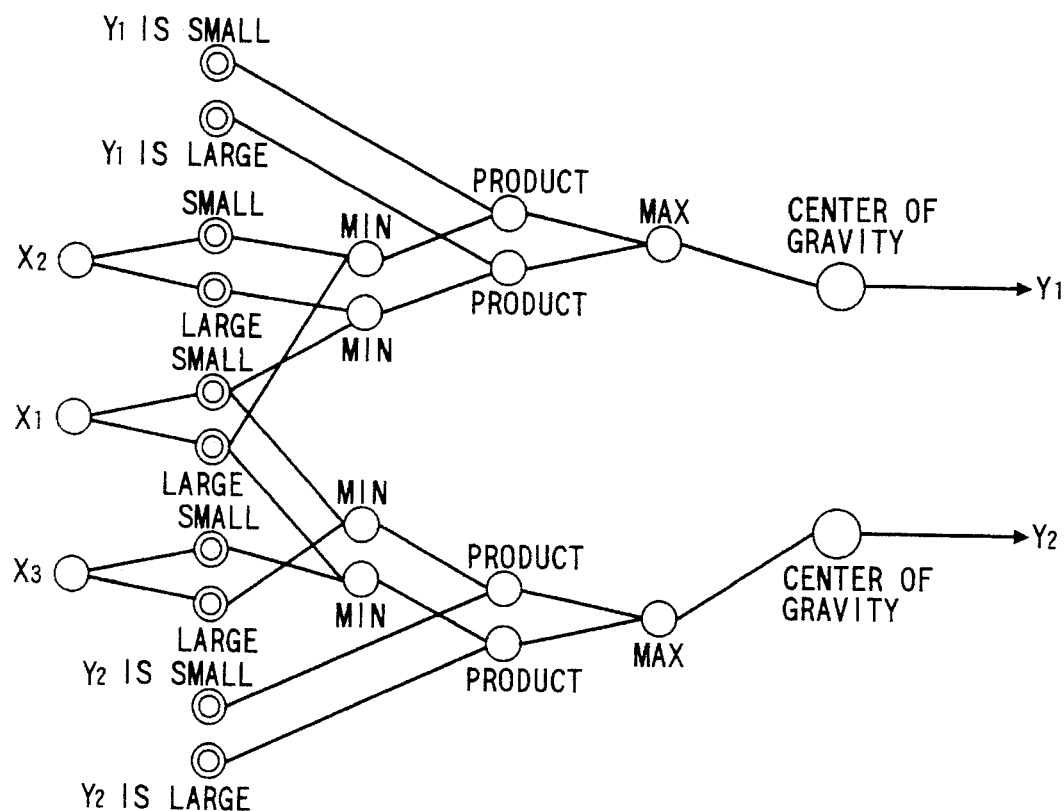
FIG. 9 is an illustration showing fuzzy inference of a plurality of combined quality parameters of element quality parameters in this embodiment.
Figure 10:
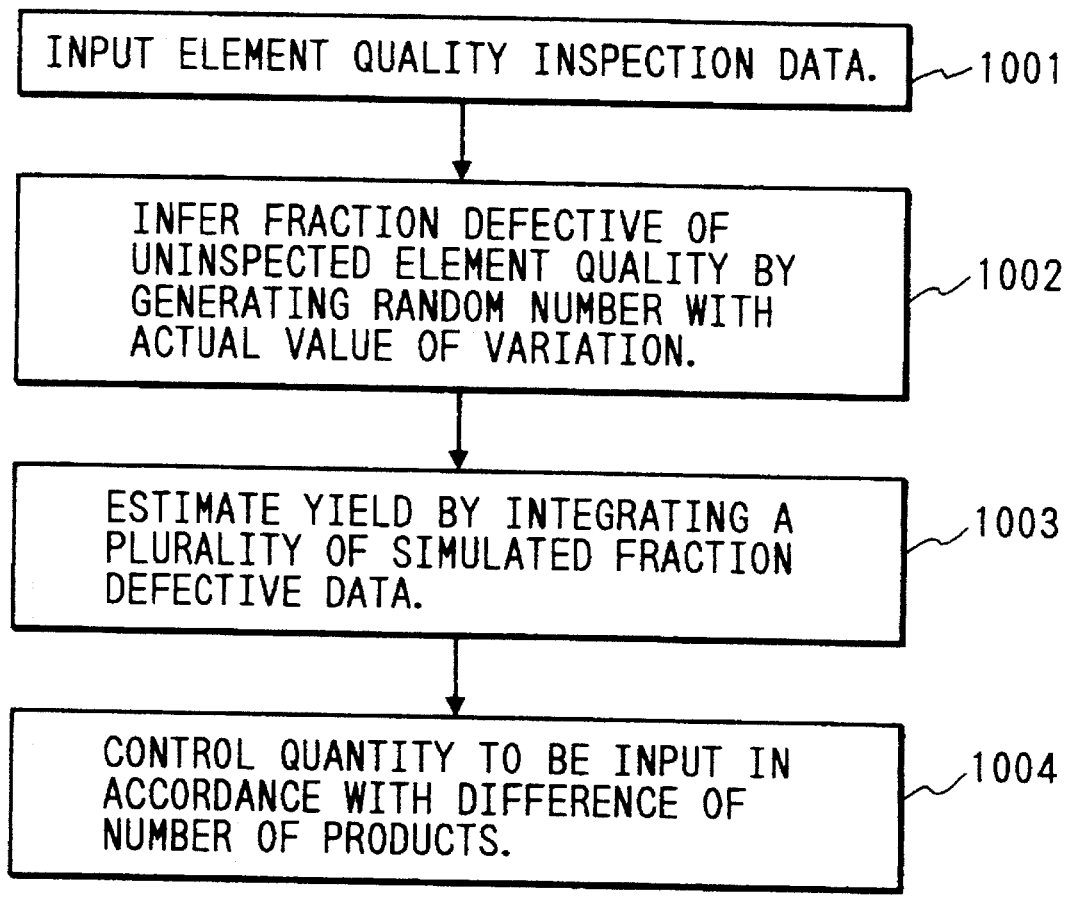
FIG. 10 is a flowchart showing a production control method in accordance with yield estimation in this embodiment.
Figure 11A:
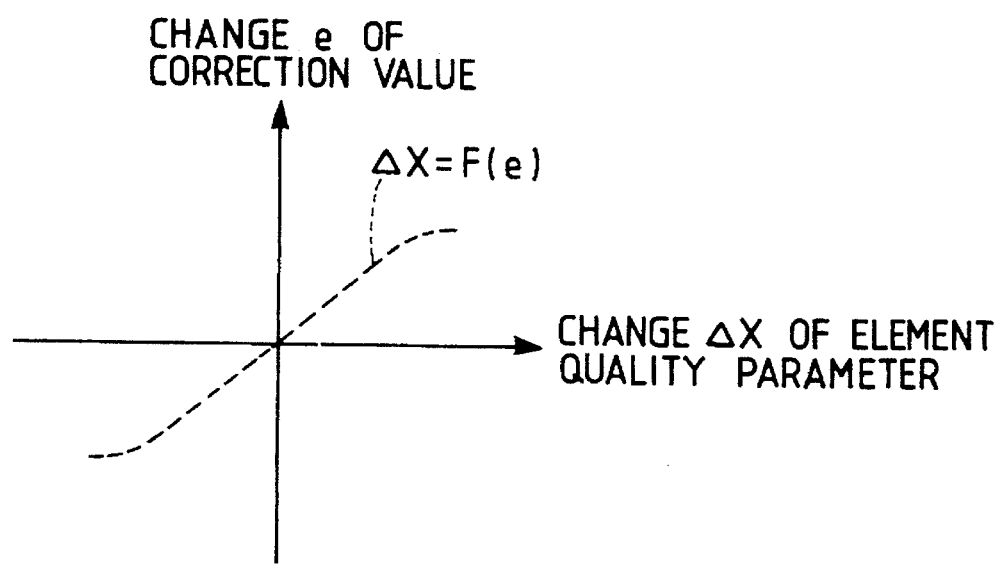
FIGS. 11(a) and 11(b) are illustrations showing a case in which a correction value is determined by using a membership function in this embodiment.
Figure 11B:
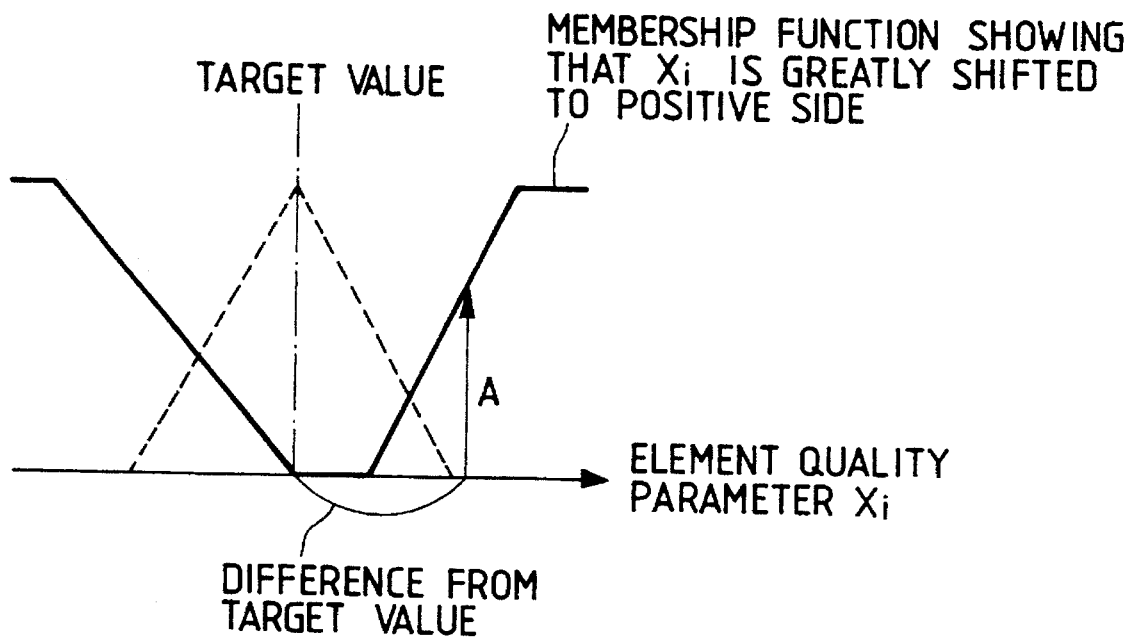

FIG. 1 is a block diagram of a semiconductor integrated circuit device fabrication apparatus which is an embodiment of the present invention, FIG. 2 is an illustration showing semiconductor integrated circuit device fabrication processes in this embodiment, FIG. 3 is a scatter diagram used for a statistical technique, FIG. 4 is a flowchart showing a fabrication-process quality control method in this embodiment, FIGS. 5(a) and 5(b) are illustrations showing an element quality parameter and combined quality parameter by a membership function, FIG. 6 is an illustration showing fuzzy inference using a membership function, FIG. 7 is an illustration showing a processing in which a membership function is converted into an element quality parameter control standard, FIG. 8 is an illustration showing a case applied to the control of the dimension accuracy and registration accuracy of a fine pattern of a semiconductor integrated circuit device, FIG. 9 is an illustration showing fuzzy inference of a plurality of combined quality parameters of element quality parameters, FIG. 10 is a flowchart showing a production control method based on yield estimation, and FIGS. 11(a) and 11(b) are illustrations showing a case in which a correction value is determined by using a membership function.

First, the constitution of the semiconductor integrated circuit device fabrication apparatus of this embodiment will be described below, referring to FIG. 1.

A semiconductor integrated circuit device fabrication apparatus of this embodiment is the one in which a fabrication method including a yield estimation function by connecting processors by means of communication means is adopted, and comprises measuring instruments $1_1$ to $1_l$, for measuring element quality parameters, inspecting devices $2_1$ to $2_m$ for measuring combined quality parameters, processors $3_1$ to $3_n$ for performing various processings in each fabrication process, and controllers $4_1$ to $4_n$ for performing the control from the processors $3_1$ to $3_n$ in accordance with a given control standard.

The measuring instruments $1_1$ to $1_l$, inspecting devices $2_1$ to $2_m$, and controllers $4_1$ to $4_n$ are connected to a data collection computer 5 for collecting various types of data. Moreover, the data collection computer 5 is connected to a quality control computer 6 for controlling the quality of the fabrication process and a data base computer 7 having a data base holding the amount of production and the like by communication means so that data is exchanged between these units. It is possible to build the controllers $4_1$ to $4_n$ in the processors $3_1$ to $3_n$ or use a group control computer for controlling the processors $3_1$ to $3_n$ instead of the controllers $4_1$ to $4_n$.

Then, the operations of the semiconductor fabrication apparatus will be described below with respect to the functions.

First, element quality data measured by the measuring instruments $1_1$ to $1_l$ and combined quality data inspected by the inspecting devices $2_1$ to $2_m$ are collected by the data collection computer 5, coordinated, and processed into a data base. Then, the data is sent to the quality control computer 6.

Then, the quality control computer 6 performs fuzzy control and matching for optimizing a membership function which are features of the present invention and returns estimated values of control standard data and combined quality data to the data collection computer 5.

Moreover, the data collection computer 5 sorts the obtained control standards into data bases for each apparatus, each product, and each process and transmits corresponding control standards and the element quality data obtained by the measuring instruments $1_1$ to $1_l$ to the controllers $4_1$ to $4_n$ for controlling the processors $3_1$ to $3_n$ when the processors $3_1$ to $3_n$ process products.

Then, the controllers $4_1$ to $4_n$ determine correction values by using the differences between the target values of given control standards and those of processing results and data showing the processing state obtained from the processors $3_1$ to $3_n$ to control the processors $3_1$ to $3_n$.

In this case, a conventional method can be used to determine the correction values for the processors $3_1$ to $3_n$ so that the control standards executed by the controllers $4_1$ to $4_n$ meet the processing results. However, it is possible to accurately determine the correction values by using an adjusted membership function obtained from the present invention to be described later.

The following is the detailed description of the processors $3_1$ to $3_n$ and correction parameters and element quality parameters related to the processors $3_1$ to $3_n$ in the semiconductor integrated circuit device fabrication process shown in FIG. 2.

In FIG. 2, reference numeral 8 represents an apparatus for forming a thin film such as of Al, 9 represents a sensitive material coater, 10 represents an exposing and developing apparatus for transferring a fine pattern, and 11 represents an etching system for etching a thin film by using a sensitive material on which a pattern is formed as a mask. Practically, these processes are repeated in which various types of thin film materials are formed in multilayer and a semiconductor integrated circuit device is produced.

In this case, it is necessary to more accurately control the element quality parameters in FIG. 2 as the integration degree of the semiconductor integrated circuit device rises. Therefore, inspection is performed by the measuring instruments $1_1$ to $1_l$ to correct the variation by operating the correction parameters. To control these element quality parameters, both the accuracy of each parameter is reproduced as expected and the accuracies at which a target value and a control range are set are important.

For example, the former accuracy depends on the reproducibility of the processings performed by the processors $3_1$ to $3_n$ and is optimized by determining the conditions of correction parameters in fabrication processes. The latter accuracy interactively depends on the circuit design, process design, and various states of actual processes, which has been set by using a statistical technique such as the correlation analysis of the scatter diagram shown in FIG. 3 or simulation and by modeling a causal relationship through trial and error.

In the case of the above conventional method, it is necessary to review a model for each type of product or every process change. Therefore, it is predicted that quality control is hardly executed when manufacturing the latest process and the latest circuit system on trial.

Moreover, the accuracy between a plurality of layers due to a device performance is interactively influenced as the pattern of a semiconductor integrated circuit device has been made smaller. Therefore it is predicted that the conventional modeling depending on the experience of the engineers and determination of the control value of the actual element quality parameter becomes difficult.

Therefore, in the case of this embodiment, it is possible to reproduce an element quality parameter as targetted and accurately control the setting of a target value and a control range by executing the quality control processing flow shown in FIG. 4.

First, the initial value of a membership function is set by using a design value and an actual value (step 401; first process), for example, as shown in FIGS. 5(a) and 5(b), a plurality of element quality parameters and quality parameters obtained by combining characteristics and yield of a semiconductor integrated circuit device which easily suffers the interactive influence of these element quality parameters are expressed by membership functions in fuzzy control.

Moreover, for example, as shown in FIG. 6, the combined quality parameters obtained from the element quality parameters is fuzzy-inferred (step 402; second process) by using these membership functions. These methods are used in the field of control as described in, for example, "FAZY-KA SEIHIN KAIHATSU NO KISO TO JITTAI", published by KAIBUNDO.

The following is the outline of an example of the control. That is, membership functions are evaluated at the antecedent of each rule to obtain the satisfaction degree of the membership functions from each element quality parameter value. In this case, the smallest AND condition is used.

Moreover, the product of antecedent by consequent is obtained. Specifically, the heads of the membership functions of the consequent are cut by the obtained satisfaction degree of the antecedent, the membership functions whose heads have been cut are superposed one upon another the result of each rule is synthesized by taking the maximum value, the center of gravity is determined, and finally the combined quality parameters are synthesized. The method described above is called Mamdani's method and widely used as described in the above book.

For the above methods, conventional fuzzy controls use the inferred results, and in the case of this embodiment, contrarily, further the inference accuracy is used as an object function, membership functions which minimize the object function are adjusted, and obtained membership function of each element quality parameter is converted into an element quality parameter control standard.

That is, a fuzzy inference rule is set in step 402 and thereafter the inference rule is adjusted by using actual process data (step 403; third process). Then, various types of element quality parameters are determined for each wafer in the semiconductor integrated circuit device fabrication process and also corresponding combined quality parameter data are collected.

A plurality of combinations of thus coordinated data values are prepared to determine the object function F of errors between combined quality parameters inferred from element quality parameters and measured combined quality parameters in accordance with the fuzzy inference rule.

For example, the sum of the squares of the errors is used as the object function F, function F and the shape of the membership function expressed by the parameters Si is changed to minimize the object function F. To refine the fuzzy inference rule, various methods have been proposed in order to improve the inference accuracy and described in, for example, "NYURO KONPYUTINGU NYUMON", Ohm-sha, LTD.

Moreover, the membership function of the element quality parameter obtained by refining the fuzzy inference rule is converted into an element quality control standard (step 404) to control the semiconductor integrated circuit device fabrication process by using the standard.

Specifically, as shown in FIG. 7, the dotted line shows the initial value of a membership function showing that an element quality parameter is correct, which gives a width to a design allowance value with a design value at the apex. The continuous line indicates a membership function obtained through the adjustment in the step 403. In the case of this example, a threshold is given to the adjusted membership function at a required satisfaction degree and a control range is obtained in a range exceeding the threshold by assuming the median of the control range as a target value.

A case will be described below in which this embodiment is applied to the control of the dimension accuracy and registration accuracy of a fine pattern of a semiconductor integrated circuit device, referring to FIG. 8.

In FIG. 8, numeral 12 represents a reference layer for superposition, 13 and 14 represent wiring layers, and 15 represents a hole for connection with the reference layer for preventing the reference layer from contacting the wiring layers 13 and 14 (this contact will be hereafter referred to as short).

In this case, the dimensions of the wiring layers 13 and 14 and the connection hole 15 and the alignment combinationally influences the quality. Moreover, it is necessary to consider the variation of a plurality of two-dimensional dimensions of a specific pattern and two-dimensional directivity of the alignment allowance. Therefore, the conventional method requires a complicated model and individual element quality is inaccurately set. For example, a faulty potential is raised or a control range is narrowed more than necessary. This causes the throughput of the process to decrease.

In the case of the method of this embodiment, however, element quality parameters are assumed as the dimensions and alignment errors of the wiring layers 13 and 14 and the connection hole 15 to adjust a membership function and convert it into a control standard in accordance with the above method by using, for example, the distances between the connection hole 15 and the wiring layer 13 and 14 as a decrease value of the alignment allowance or the occurrence rate of shorts as a fraction defective due to decrease of the alignment allowance as combined quality parameter.

In this case, by determining a value by optimizing the initial value at the design stage, it is possible to obtain an initial value preferable for process design and accurate adjustment considering a process state.

Moreover, element quality parameters relating to shorts include a film thickness and reflectance which are element quality parameters of the thin film forming apparatus 8, and relate to the side etching value of the etching system 11. The short element quality parameters can be added to the rule. Therefore, the method of this embodiment makes it possible to transform the interactive influence between the pattern shape and the other process parameters both of which have been hard to correlate to each other into a control standard.

Moreover, to the alignment accuracy as an element quality, not only a deviation but also other error factor analysis results such as reduction rate, shot spin, image distortion, wafer spin, and pitch deviation which are frequently used to control the exposing and developing apparatus 10.

In the above description, an example has been described in which a plurality of element quality parameters interactively influence a combined quality parameter. However, the present invention is not restricted to this. When a process is further complicated due to the pattern size reduction, an element quality parameter frequently influences other combined quality parameters due to interaction with other element quality parameters. A simple example in which the present invention is applied to the above case will be described below, referring to FIG. 9.

In FIG. 9, symbols $X_1$, $X_2$, and $X_3$ represent element quality parameters and $Y_1$ and $Y_2$ represent combined quality parameters. FIG. 9 illustrates the Mamdani's inference rule.

Similarly to the method described above, an object function for adjusting membership functions is, $F=((Y_1'-Y_1)^2+(Y_2'-Y_2)^2)$, where measured combined quality parameters are $Y_1'$ and $Y_2'$. A method for converting obtained membership functions into each element quality parameter control standard is the same as the method described above.

In this case, by using the combined quality parameters as a plurality of fraction defective data due to a plurality of failure modes, it is possible to set an element quality parameter control standard in connection with a plurality of failure modes.

The inference rule for inferring the plurality of combined quality parameters thus adjusted can be used to convert a membership function into an element quality parameter control standard like the method already described, and moreover, the inference results can be used to control the production in the semiconductor integrated circuit device fabrication process.

For example, various methods have been studied to control the production by estimating the yield so far. However, because these conventional methods estimate the fraction defective of a single defective mode through time-series analysis of yield and element quality parameters whose correlation can comparatively easily be obtained, it is difficult to keep the accuracy in the fabrication process of a semiconductor integrated circuit device which easily suffer the interactive influence of various element quality parameters.

Therefore, a production control method based on yield estimation will be described below, referring to the processing flow in FIG. 10.

First, inspection data of a plurality of element quality parameters is inputted (step 1001) to generate random numbers by use of actual values of variations for uninspected element qualities in accordance with the measurement results and to fuzzy-infer the fraction defective of a semiconductor integrated circuit devices due to a plurality of failure modes (step 1002; fourth process).

Then, a plurality of simulated fraction defective data values are integrated to estimate the yield of the semiconductor integrated circuit devices by use of the inferred fraction defective (step 1003), to control the quantity to be inputted by use of the deviation of the number of products, and to control the production (step 1004; fifth process).

Thereby, it is possible to adjust the inference rule about a plurality of failure modes by the above mentioned method by widely taking element quality parameters in the semiconductor integrated circuit device fabrication process and using the fraction defectives of a plurality of failure modes as a plurality of combined quality parameters.

This embodiment makes it possible to completely adjust the inference rule by connecting the host data collection computer 5, measuring instruments $1_1$ to $1_l$, and inspecting devices $2_1$ to $2_m$ by communication lines to collect data and processing the data by the high-speed quality control computer 6 through the data and the calculation load required for adjustment of the inference rule is greatly increased.

It is also possible to use a calculation accelerating technique described in the "NYURO KONPYUTING NYUMON" Ohmsha, LTD. by analytically obtaining a partially-differentiated factor of an object function with respect to parameters of membership functions from an inference-rule calculation formula in advance.

A method will be described below, referring to FIGS. 11(a) and 11(b) are method illustrations which is effective to determine the correction values for processors $3_1$ to $3_n$ by using the adjusted membership functions obtained by this embodiment and applying the method to a line such as an FA line in which the element quality is comparatively stable.

That is, in the prior art, a method has been used in which the influence of the change e of a correction value close to the target value on the element quality parameter change ΔX is previously obtained from experiments or in the stage of the design as shown by a dotted line in FIG. 11(a) to determine a correction value using the equation ΔX=F(e).

However, because the time difference is large between processing and inspection in the FA line, the above method causes errors and thereby the quality may be made unstable in such a line that the element quality is stable. In this case, it is empirically performed that small differences are not corrected or insufficiently corrected.

Therefore, this embodiment makes it possible to set such dead zone and an acceleration factor of control according to the degree of influence of the combined quality parameters such as the yield.

For example, FIG. 11(b) shows a membership function, among membership functions obtained by the above adjustment, showing that an element quality parameter is deviated to the positive side. Moreover, in FIG. 11(b), the deviation of a measured element quality parameter is e. Thus, the expression ΔX=AF(e) is obtained, wherein the satisfaction degree A corresponding to the deviation e is an acceleration factor. Thereby, it is possible to stably control the quality because of the same reason as the above mentioned.

Therefore, the semiconductor integrated circuit device fabrication apparatus of this embodiment makes it possible to accurately estimate the influence of the interaction of element quality parameters on the variation of combined quality parameters by using membership functions in fuzzy inference, and moreover improve the accuracy of combined quality parameters by converting the membership function obtained through adjustment into an element quality control standard and by controlling the processors $3_1$ to $3_n$ in accordance with the element quality parameter control standard.

Moreover, because it is possible to estimate the total yield due to a plurality of failure modes, the production efficiency can be improved by accurately controlling the final production in proper quantities.

The invention made by the inventer of the present invention was concretely described above in accordance with the embodiments. However, the present invention is not restricted to the above embodiments but, of course, it can be variously modified.

For example, the semiconductor integrated circuit device fabrication apparatus of this embodiment was described particularly regarding a case in which it is used for the registration of circuit patterns and the control of the exposure. However, the present invention is not restricted to the embodiment but it can widely be applied to other semiconductor integrated circuit device fabrication processes for which interactive optimization of process element quality is required.

The following are brief descriptions of advantages of typical inventions among those disclosed in this application.

(1) The semiconductor integrated circuit device fabrication yield can be improved because it is passible to improve the accuracy of the control standard coordinated with faults and electric characteristics of circuits considering the influence of interaction of a plurality of element quality parameters by controlling the element quality parameters of the quality control in a semiconductor integrated circuit device fabrication process by means of fuzzy inference, adjusting the parameters of a membership function in the fuzzy inference to minimize the inference error, using the adjusted membership function as an element quality parameter control standard and thereby controlling the semiconductor integrated circuit device fabrication process.

(2) The throughput of the processors can be improved because it is unnecessary to make the control accuracy excessively severe thanks to the above Item (1).

(3) It is possible to decrease the number of engineers and the cost because a control standard which has manually been analyzed for each type of product so far can be automatically be set by a method unified between types of products and between processes in accordance with the above Item (1).

(4) It is possible to shorten the initiating period of a new product because fabricating processes can accurately be adjusted at the stage of trial manufacture in accordance with the above Item (1).

(5) It is possible to improve the production control accuracy and the production efficiency because the final yield can be estimated for a plurality of failure modes by element quality data in process in accordance with the above Item (1).

What is claimed is:

1. A semiconductor integrated circuit device fabrication method for quality control semiconductor integrated circuit device fabrication processes, comprising the steps of adjusting membership functions used in fuzzy inference to improve the accuracy of inferring yield of the semiconductor integrated circuit device by using fuzzy inference, and controlling the semiconductor integrated circuit device fabrication processes under a desirable element quality parameter state obtained from the adjusted membership functions.

2. A semiconductor integrated circuit device fabrication method for quality control, in semiconductor integrated circuit device fabrication processes, comprising the steps of fuzzy-inferring element quality parameters, adjusting parameters of membership functions of element qualities used in fuzzy inference to minimize inference errors, and controlling the semiconductor integrated circuit device fabrication processes by using the adjusted membership functions as a control standard of the element quality parameters.

3. A semiconductor integrated circuit device fabrication method according to claim 2, wherein the fuzzy inferring step comprises a first step of expressing the element quality parameter control standard by a membership function in fuzzy control, a second step of fuzzy-inferring combined quality parameters by using a plurality of element quality membership functions, and a third step of minimizing the sum of the squares of combined quality parameter errors fuzzy-inferred by a plurality of combinations of measured element quality parameters and corresponding measured combined quality parameter errors by adjusting parameters of membership functions showing the standard of the element quality parameters, wherein the membership functions obtained through the adjustment in the third step are used as the control standard of the element quality parameters.

4. A semiconductor integrated circuit device fabrication method according to claim 3, wherein the semiconductor integrated circuit device fabrication process is for quality control of a fine pattern formation, the element quality parameters are used as the registration accuracy and the dimension accuracy of a plurality of layers, a standard of the registration accuracy and the dimension accuracy of the layers is expressed in the first step, the decrease of the registration allowance due to combination of the registration accuracy and the dimension accuracy of the layers is fuzzy-inferred as the combined quality parameters in the second step, the membership functions are adjusted by using the registration allowance fuzzy-inferred by the measured registration accuracy and dimension accuracy of the layers and teacher data for measured registration allowance in the third step, and the membership functions determined through the above adjustments are used as the control standard of the registration accuracy and the dimension accuracy of the layers.

5. A semiconductor integrated circuit device fabrication method according to claim 4, wherein the combined quality parameters are used as data of fraction defective in semiconductor integrated circuit devices due to decrease of registration allowance, the data of the fraction defective in semiconductor integrated circuit devices due to decrease of registration allowance are fuzzy-inferred in the second step, the membership functions are adjusted by using the registration allowance fuzzy-inferred by the measured registration accuracy and dimension accuracy of a plurality of layers and teacher data of the measured fraction-defective data in the third step, and the membership functions determined through the above adjustment are used as the control standard of the registration accuracy and dimension accuracy of a plurality of layers.

6. A semiconductor integrated circuit device fabrication method according to claim 3, wherein the combined quality parameters are used as data for fraction defective in semiconductor integrated circuit devices due to a plurality of failure modes, the data for fraction defective in semiconductor integrated circuit devices due to the plurality of failure modes are fuzzy-interred in the second step, the membership functions are adjusted by using the fraction defective data of the failure modes fuzzy-inferred by a plurality of measured element quality parameters and the teacher data of the measured fraction defective data in the third step, and the membership functions determined through the adjustment are used as the control standard of a plurality of element quality parameters.

7. A semiconductor integrated circuit device fabrication method according to claim 6, comprising a fourth process of fuzzy-inferring the fraction defective in semiconductor integrated circuit devices due to the defective modes based on the results of measurement of the element quality parameters by using the membership functions determined by the adjustment in the third stop, and a fifth step of estimating the yield of the semiconductor integrated circuit devices in accordance with the fraction defective inferred in the fourth step, wherein production is controlled according to the estimated values obtained in the fifth step.

8. A semiconductor integrated circuit device fabrication apparatus used in forming a semiconductor integrated device using fuzzy inference for quality control comprising the first step of expressing an element quality parameter control standard by a membership function in fuzzy control, a second step of fuzzy-inferring combined quality parameters by using a plurality of element quality membership functions, and a third step of minimizing the sum of the squares of combined quality parameter errors fuzzy-inferred by a plurality of combinations of measured element quality parameters and corresponding measured combined quality parameter errors by adjusting parameters of membership functions showing the standard of the element quality parameters, and controlling the semiconductor integrated circuit device fabrication processes by using the membership functions obtained through the adjustments in the third step as a control standard of the element quality parameters, comprising:

measuring instruments for measuring the element quality parameters;

inspecting devices for measuring the combined quality parameters;

data transfer means for connecting said measuring instruments and said inspecting devices; and a data processor for coordinating the first, second, and third steps, qualities, measuring points, and sample number of the semiconductor integrated circuit devices, collection of data from the measuring instruments and the inspecting devices, adjustment of the membership functions, and for performing inference of the combined quality parameters and controlling the qualities in the semiconductor integrated circuit device fabrication process.

* * * * *